United States Patent
Ito

(10) Patent No.: US 9,640,272 B2
(45) Date of Patent: May 2, 2017

(54) SEMICONDUCTOR DEVICE CONTROL CIRCUIT AND METHOD THEREOF

(71) Applicant: Powerchip Technology Corporation, Hsinchu (TW)

(72) Inventor: Nobuhiko Ito, Tokyo (JP)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/819,451

(22) Filed: Aug. 6, 2015

(65) Prior Publication Data

US 2016/0232982 A1    Aug. 11, 2016

(30) Foreign Application Priority Data

Feb. 5, 2015    (JP) ................................. 2015-020928

(51) Int. Cl.
| | | |
|---|---|---|
| *G11C 8/18* | (2006.01) | |
| *G11C 16/32* | (2006.01) | |
| *G11C 16/20* | (2006.01) | |
| *G11C 7/10* | (2006.01) | |
| *G11C 16/04* | (2006.01) | |

(52) U.S. Cl.
CPC ............ *G11C 16/32* (2013.01); *G11C 7/1063* (2013.01); *G11C 16/0483* (2013.01); *G11C 16/20* (2013.01)

(58) Field of Classification Search
CPC ..... G11C 13/0004; G11C 7/22; H04N 21/235
USPC ........................................ 365/233.12, 233.11
See application file for complete search history.

(56) References Cited

U.S. PATENT DOCUMENTS

| | | | |
|---|---|---|---|
| 6,850,434 B2 | 2/2005 | Miwa et al. | |
| 8,270,552 B1 | 9/2012 | Oner | |
| 2007/0040715 A1* | 2/2007 | Usugi | ...................... H03M 9/00 341/101 |
| 2008/0253214 A1* | 10/2008 | Stimak | ...................... G06F 1/30 365/227 |
| 2014/0032941 A1* | 1/2014 | Kajigaya | ................... G06F 1/26 713/300 |

FOREIGN PATENT DOCUMENTS

| | | |
|---|---|---|
| JP | H09147582 | 6/1997 |
| JP | 2002150780 | 5/2002 |

OTHER PUBLICATIONS

"Office Action of Taiwan Counterpart Application", issued on Jul. 25, 2016, p. 1-p. 7.

* cited by examiner

*Primary Examiner* — Anthan Tran
(74) *Attorney, Agent, or Firm* — Jianq Chyun IP Office

(57) ABSTRACT

In a semiconductor device, the reset command input process may be executed by a simple method and circuit in a short period of time when a reset command is inputted compared to conventional art. A control circuit for the semiconductor device is adapted to control a clock generator for generating a system clock having a changeable frequency, wherein, in a normal operating mode of the semiconductor device, the control circuit changes the frequency of the system clock generated by the clock generator from a first frequency to a second frequency that is higher than the first frequency according to a reset command, and performs an interrupt process on the semiconductor device, so as to enter a reset sequence mode from the normal operating mode.

4 Claims, 9 Drawing Sheets

SEMICONDUCTOR DEVICE CONTROL CIRCUIT AND METHOD THEREOF

CROSS-REFERENCE TO RELATED APPLICATION

This application claims the priority benefits of Japanese Patent Application No. 2015-020928, filed on Feb. 5, 2015. The entirety of the above-mentioned patent application is hereby incorporated by reference herein and made a part of this specification.

BACKGROUND OF THE INVENTION

1. Field of the Invention

The invention relates to a semiconductor device, and relates particularly to a write-in/erase circuit of an electronically rewritable non-volatile semiconductor memory device (EEPROM) such as a flash memory, and a method thereof.

2. Description of Related Art

It is known in the art that a highly integrated NAND type non-volatile semiconductor memory device may be constructed by connecting a plurality of memory cell transistors (referred to as "memory cell" below) in series between bit lines and source lines to form a NAND string (for example, refer to Patent Document 1).

FIG. 1 is a block diagram illustrating an overall construction of a NAND type flash EEPROM relating to conventional example. FIG. 2 is a circuit diagram illustrating a construction of a memory cell array 10 of FIG. 1 and the peripheral circuit thereof.

Referring to FIG. 1, a NAND type flash EEPROM relating to a conventional example includes a memory cell array 10, a control circuit 11 for controlling the operation thereof, a row decoder 12, a high voltage generating circuit 13, a page buffer circuit 14 including a data rewriting and reading-out circuit, a column decoder 15, a command register 17, an address register 18, an operation logic controller 19, a status register 20, a Ready/Busy-bar ($RY/\overline{BY}$) output terminal 53, a data input/output buffer 50 and a data input/output terminal 51.

In the memory cell array 10, a NAND cell unit NU (NU0, NU1, . . . ) is constructed by, for example, connecting 16 stack-gate structured electrically rewritable non-volatile memory cells MC0~MC15 in series, as shown in FIG. 2. The drain end of each NAND cell unit NU is connected to a bit line BL through a selective gate transistor SG1 and the source end of each NAND cell unit NU is connected to a common source line CELSRC through a selective gate transistor SG2. The control gates of the memory cells MC arranged in row directions are coupled to a common word line, and the gate electrodes of the selective transistor SG1, SG2 are connected to the selective gate lines SGD, SGS arranged parallel to the word lines WL. One page, which is a write-in or readout unit, is a range of the memory cell selected by one word line WL. One block, which is a data erasing unit, is a range of a plurality of NAND cell units NU of one page or its integer multiples. In order for performing rewriting and reading of the data of the page unit, the page buffer circuit 14 includes a sense amplifier circuit (SA) and a latch circuit (DL) in each bit line.

The memory cell array 10 of FIG. 2 has a simplified structure, however, in which it can have a structure wherein a plurality of bit lines can share a page buffer. In this case, when writing in or reading out data, the number of bit lines which are selectively connected to the page buffer is a one page unit. FIG. 2 shows the range of the cell array within which data is inputted or outputted by one data input/output terminal 51. In order to select the word line WL of the memory cell array 10 and the bit line BL, the row decoder 12 and the column decode 15 are respectively arranged. The control circuit 11 carries out sequence control of data writing, erasing, and reading. The high voltage generating circuit 13 which is controlled by the control circuit generates a high voltage or a middle voltage used for data writing, erasing, and reading. The status register 20 controlled by the control circuit 11 stores pass/fail information of program or erase just finished and the status of the chip during programming, erasing and reading or not. And the status output from the Ready/Busy-bar ($RY/\overline{BY}$) terminal 53 as: high is ready to next operation, and low is busy to do current operation.

The input/output buffer 50 is used to input/output data and input address signals. Specifically, data is transmitted between the input/output terminal 51 and the page buffer 14 through the input/output buffer 50 and the data line 52. The address signals inputted from the input/output terminal 51 are stored in the address register 18 and sent to the row decoder 12 and the column decoder 15 for decoding. The action control command is also inputted from the input/output terminal 51. The inputted command is decoded and stored in the command register 17 such that the command controls the control circuit 11. The external control signals, such as chip enable signals CEB, command latch enable signals CLE, address latch enable signals ALE, write-in enable signals WEB, readout enable signals REB, and so on, are brought into the operation logic controller 19. Thus, the inner control signals are generated corresponding to an action mode. The inner control signals are used to control data latching or transmitting processes on the input/output buffer 50, and further transmitted to the control circuit 11 for action controlling.

The page buffer 14 has two latch circuits 14a, 14b for multi-valued action or cache functions which are executed by switching. Specifically, when one memory cell memorizes a two value data of one bit, a cache function is provided. When one memory cell memorizes a four value data of two bits, a multi-value function is provided or a cache function still is effective even though the cache function is limited by address.

CONVENTIONAL ART DOCUMENTS

Patent Documents

[Patent Document 1] Japan Laid Open Patent H09-147582

[Patent Document 2] Japan Laid Open Patent 2002-150780

Problem to be Solved

FIG. 3a is a timing chart of each signal when a reset command (FFh) is inputted during a program of the NAND type flash EEPROM of FIG. 1. FIG. 3b is a timing chart of each signal when a reset command (FFh) is inputted during a data erase of the NAND type flash EEPROM of FIG. 1. In FIG. 3, $t_{RST}$ is the reset time. Herein, for example, as illustrated in FIG. 3a, the internal voltage VPP is a high voltage during programming, and after the program operation is executed by command 80-10 ($RY/\overline{BY}$ becomes low), the resetting process is performed by FF command ($RY/\overline{BY}$ returns to high).

In NAND type flash memory, if a reset command is inputted during the program, the flash memory will stop processing of the present program and enter a stand-by state. The most important internal process in the flash memory when a reset is performed is to electrically discharge the high voltages and the mid voltages such as the word lines, the bit lines, the well, the row decoder and the charge pump. If a number of electrical charge remain, there is a possibility that the flash memory will be damaged. Therefore, the reset sequence is designed to focus on the electrical discharge of the high voltages (HV). The problem of reset is that the margin between the actual reset time with respect to a specified value is very small. Here, the reset time includes the electrical discharge time and other control times.

FIG. 4 is a flow chart illustrating the process of a reset command input executed in the NAND type flash EEPROM of FIG. 1.

Referring to FIG. 4, in step S1, first it is determined whether data is being read out. When YES, step S2 is entered, when NO, step S3 is entered. In step S2, the read out reset sequence process is executed, and then step S9 is entered. On the other hand, in step S3, it is determined whether it is in program mode. When YES, step S4 is entered, when NO, step S6 is entered. In step S4, it is determined whether it is verifying. When YES, step S2 is entered, when NO, step S5 is entered. In step S5, the program reset sequence process is executed, and then in step S9 is entered. In step S6, it is determined whether it is in erase mode. When YES, step S7 is entered, when NO, step S9 is entered. In step S7, it is determined whether it is verifying. When YES, step S2 is entered, when NO, step S8 is entered. In step S8, the erase reset sequence process is executed, and then in step S9 is entered. In step S9, other processing is executed and the reset command input process is completed.

In addition, in the program reset sequence process of step S5, many signal setting cycles are required in the below processes.

(1) Setting the Y reset signal;
(2) Setting the X reset signal;
(3) Switching off the word line high voltage charge pump;
(4) Setting the word line high voltage electrical discharge;
(5) Setting the wait time and other signals;
(6) Switching off the high voltage charge pump of peripheral circuit;
(7) Setting the high voltage electrical discharge of peripheral circuit;
(8) Setting other wait times and other signals;
(9) Switching off the mid voltage charge pump of peripheral circuit;
(10) Setting the mid voltage electrical discharge of peripheral circuit; and
(11) Resetting of various signals.

When the reset command is inputted, and after the reset command is decoded, the CPU controlling the NAND type flash memory temporarily suspends the operation currently being executed. This process expends many clock cycles. Because of the electrical discharge of the electrical load, the electrical discharge path cannot be cut off, and as a result the gate of the electrical discharge path transistor is required to retain electrical voltage for a period of time. Here, it is required to send a plurality of control signals based on the clock at suitable timings. These control signals will require many clock cycles. In this way, a long electrical discharge time and many signal clock cycles are consumed resulting in a reduction of the margin of the specified value.

An objective of the invention is to provide a semiconductor device and a control circuit of the semiconductor device and a method thereof, such that compared to conventional art the reset command process may be executed in a short period of time when a reset command is inputted, for example, in a non-volatile memory device such as a flash memory.

SUMMARY OF THE INVENTION

Solution to the Problem

A control circuit for a semiconductor device of the invention is adapted to control a clock generator for generating a system clock having a changeable frequency, wherein in a normal operating mode of the semiconductor device, the control circuit changes the frequency of the system clock generated by the clock generator from a first frequency to a second frequency that is higher than the first frequency according to a reset command, and performs an interrupt process on the semiconductor device, so as to enter a reset sequence mode from the normal operating mode.

In an embodiment of the invention, the control circuit includes the clock generator for generating a predetermined base clock and a frequency divider for generating the system clock by dividing a frequency of the base clock from the clock generator.

In an embodiment of the invention, the control circuit for the semiconductor device further includes another clock generator provided in addition to the clock generator, and for generating a charge pump clock of a charge pump circuit for the semiconductor device.

In an embodiment of the invention, the clock generator further comprises a circuit for changing the frequency of the system clock according to a reset mode signal of a plurality of bits.

A semiconductor device of the invention includes the control circuit for the semiconductor device.

In an embodiment of the invention, the semiconductor device is a non-volatile memory device.

In an embodiment of the invention, the second frequency is different in a read out, a write-in or an erase mode.

In the control circuit of the semiconductor memory device and method thereof of the invention, compared to conventional art, the reset command input process may be executed by a simple method and circuit in a short period of time when a reset command is inputted, for example, in a non-volatile memory device such as a flash memory.

DESCRIPTION OF THE EMBODIMENTS

Figure 1:
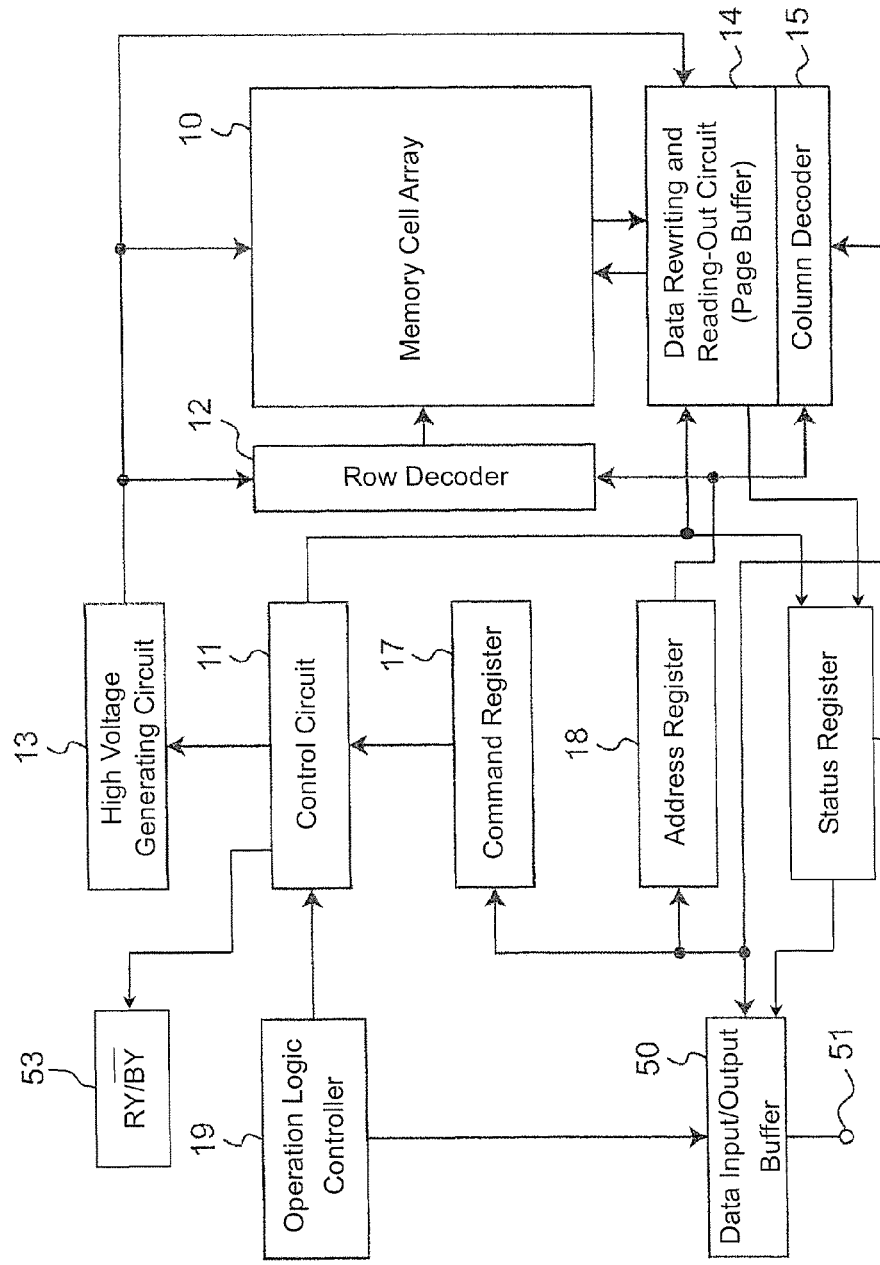
FIG. 1 is a block diagram illustrating an overall construction of a NAND type flash EEPROM relating to conventional example.
Figure 2:
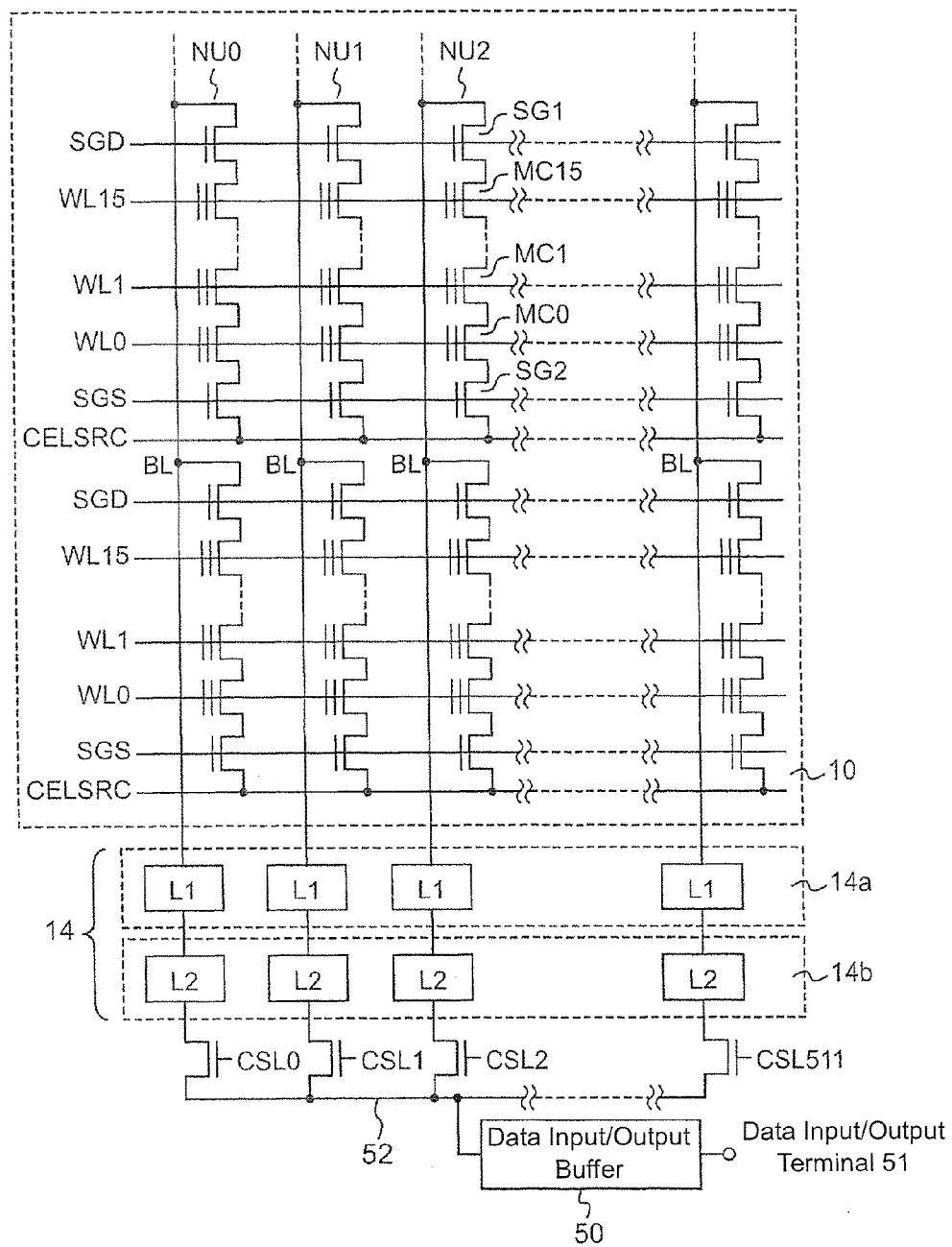
FIG. 2 is a circuit diagram illustrating a construction of a memory cell array 10 of FIG. 1 and the peripheral circuit thereof.
Figure 3A:
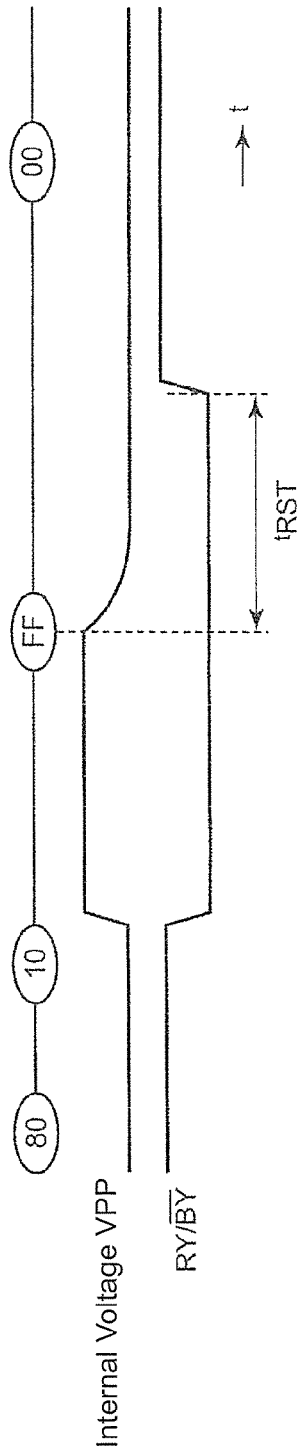
FIG. 3a is a timing chart of each signal when a reset command (FFh) is inputted during a program of the NAND type flash EEPROM of FIG. 1.
Figure 3B:
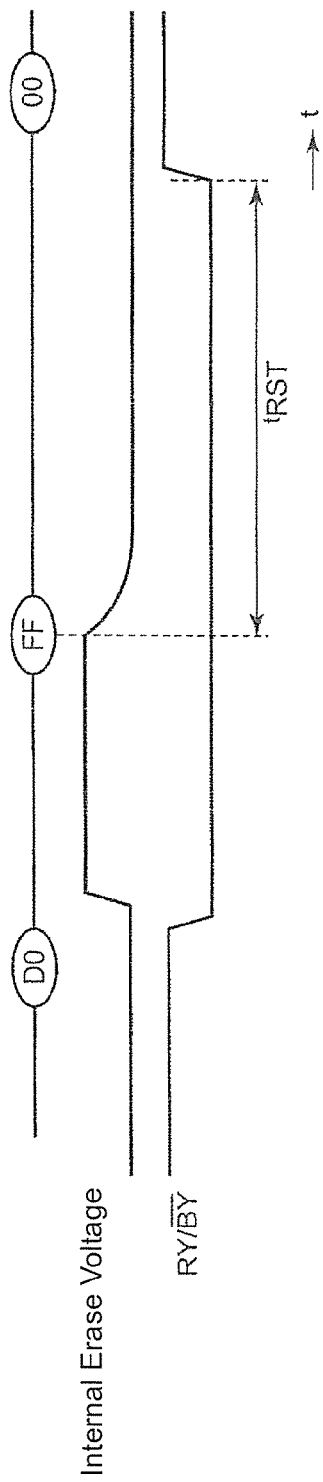
FIG. 3b is a timing chart of each signal when a reset command (FFh) is inputted during a data erase of the NAND type flash EEPROM of FIG. 1.

Reference will now be made in detail to the present preferred embodiments of the invention, examples of which are illustrated in the accompanying drawings. Wherever possible, the same reference numbers are used in the drawings and the description to refer to the same or like parts.

Embodiment

Figure 5:
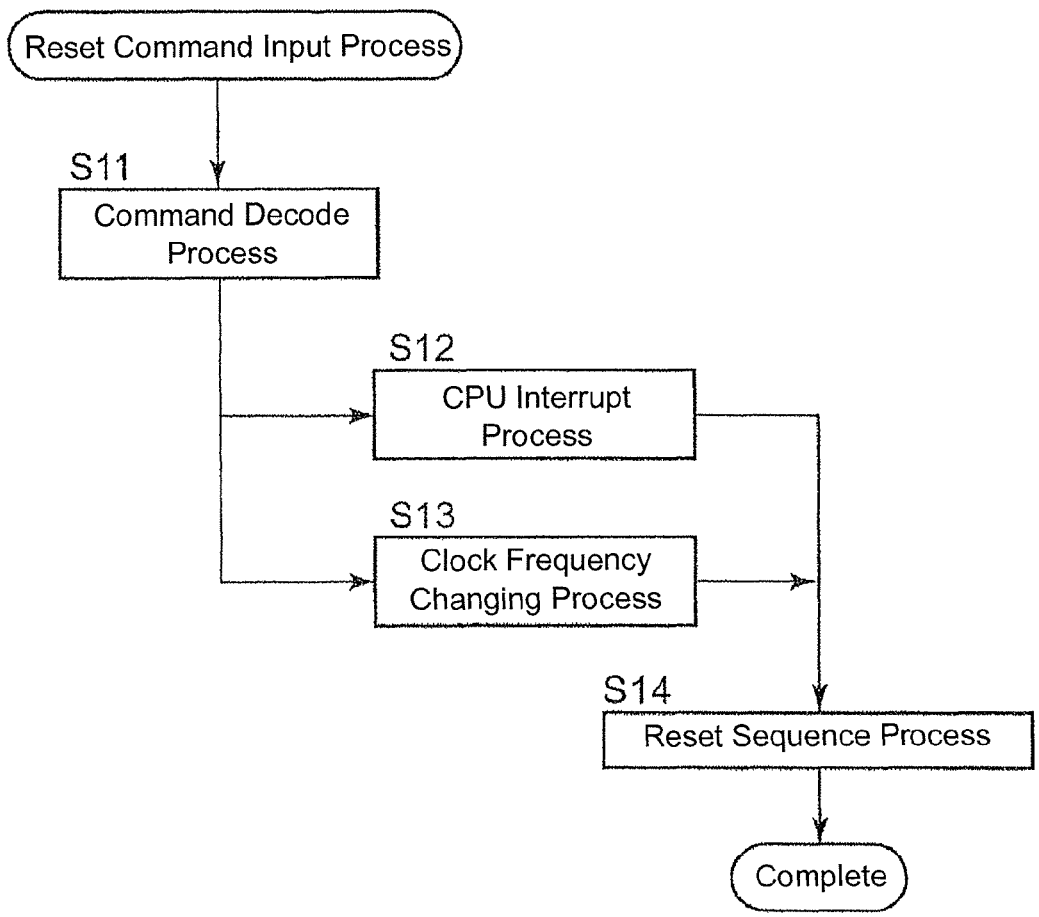
FIG. 5 is a flow chart illustrating the process of a reset command input relating to an embodiment of the invention.
Figure 6:
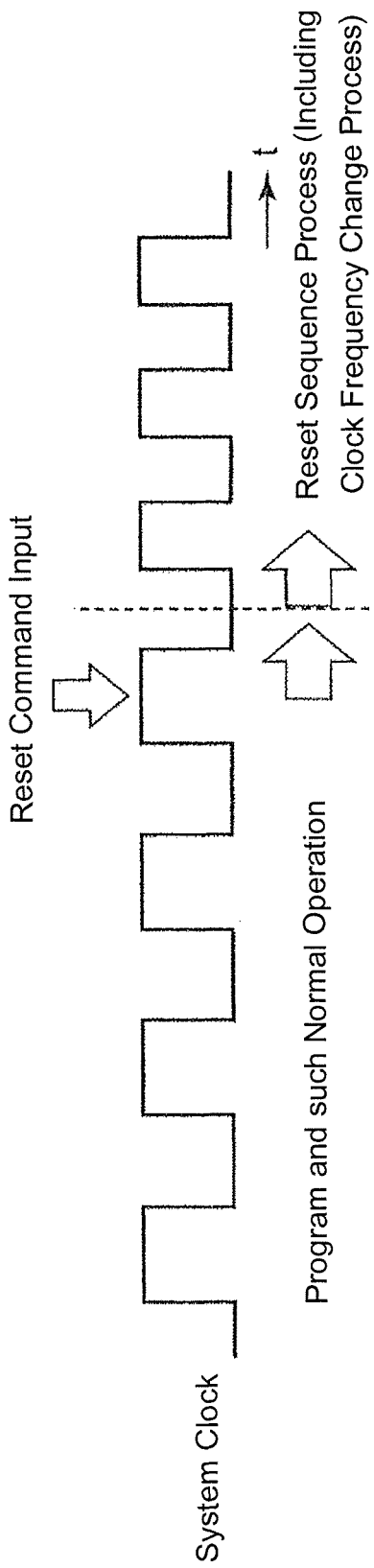
FIG. 6 is a timing chart of a system clock illustrating the process of the reset command input of FIG. 5.

FIG. 5 is a flow chart illustrating the process of a reset command input relating to an embodiment of the invention. FIG. 6 is a timing chart of a system clock illustrating the process of the reset command input of FIG. 5.

Figure 4:
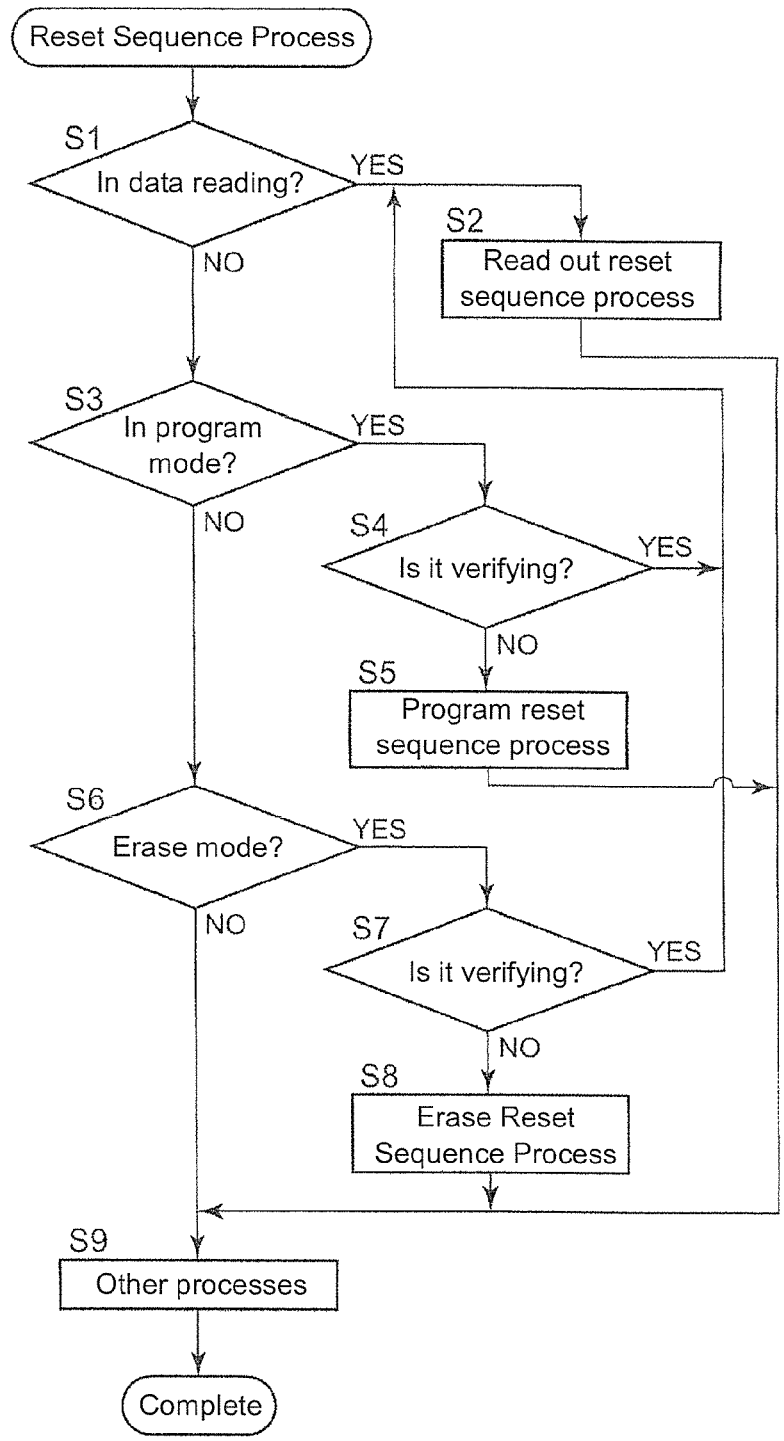
FIG. 4 is a flow chart illustrating the process of a reset command input executed by the NAND type flash EEPROM of FIG. 1.

Referring to FIG. 5, when a reset command is inputted, first in step S11, command decode process is executed to decode the reset command. Next, the processes in step S12 and S13 are executed. In step S12, a CPU interrupt process is executed. In step S13, a clock frequency changing process (FIG. 6) is executed, and then in step S14 other processes are executed and the reset command input processing is completed. When the reset command is recognized in step S11, the CPU enters reset sequence mode in step S12, and the reset sequence process shown in FIG. 4 is executed in step S14.

In the reset sequence process of the present embodiment, the cycle time of the clock may be shortened by setting the system clock frequency higher than a frequency during normal operation. In conventional art, a CPU interrupt process is executed when a reset command is inputted and the reset sequence is entered from normal operations. Here, the CPU may be the control circuit 11 or may be a CPU such as an external controller.

In the present embodiment, the control signal for changing the clock frequency is additionally generated. Here, the clock frequency is determined so as to be optimal for normal operation. Normal operation includes various processes such as power source setup, boosting control of high voltages for the word line and the well and operation mode change. However, the reset sequence includes only the discharging processing which is simpler than the normal processes. As a result, a higher frequency is able to be used. If the frequency is increased by 10%, the reset time $t_{RST}$ may be reduced by 10% at the maximum.

Figure 7:
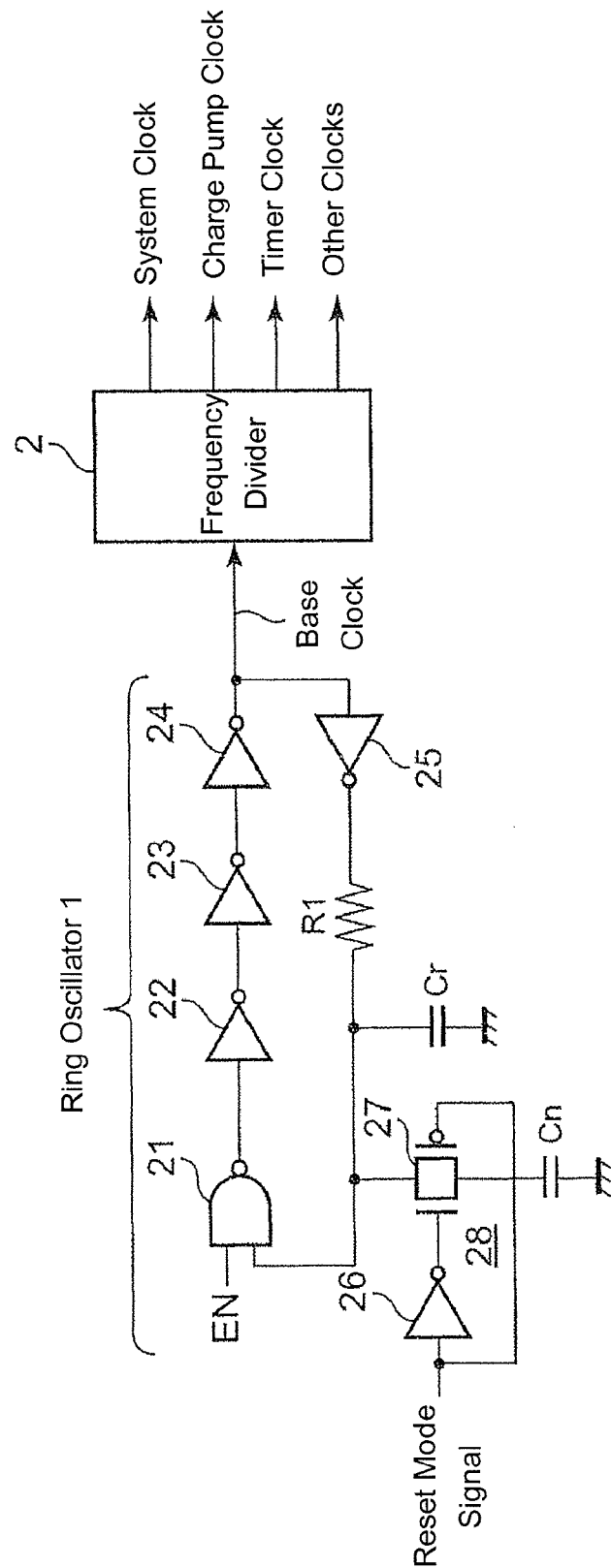
FIG. 7 is a circuit diagram illustrating a construction example of a clock generating circuit relating to an embodiment of the invention.

FIG. 7 is a circuit diagram illustrating a construction example of a clock generating circuit relating to an embodiment of the invention. In FIG. 7, a clock generating circuit includes a ring oscillator 1 and a frequency divider 2. Here, the ring oscillator 1 is formed by including a loop circuit formed by a NAND gate 21, inverters 22~25 and a resistor R1 all formed in a loop shape, a capacitor Cr for determining a base oscillation frequency and connected to the resistor R1, a capacitor Cn for determining an adjustment oscillation frequency and connected to an end of the resistor R1 through the transmission gate 27. Here, the on/off of the oscillation of the ring oscillator 1 may be controlled based on the clock enable signal EN that is inputted to the NAND gate 21. In addition, a reset mode signal is inputted to a non inverting control input terminal of the transmission gate 27 and is inputted to an inverting control input terminal of the transmission gate 27 through an inverter 26. Here, a capacitor circuit 28 for switching the capacitor Cn to connect to the loop circuit of the ring oscillator 1 or not according to a reset mode signal is formed by the capacitor Cn, the transmission gate 27 and the inverter 26.

The frequency divider 2 generates the system clock, the charge pump clock, the timer clock and other clocks by dividing the frequency of a base clock generated by the ring oscillator 1.

The clock generating circuit constructed above is operated as below.

(1) In a normal operating mode where the reset mode signal is not inputted, the transmission gate 27 is switched on and the oscillation frequency $f_{normal}$ of the base clock to ignore the inverter delay is expressed in the following expression

[Equation 1]

$$f_{normal} = \frac{1}{2\pi(Cr + Cn)R1} \quad (1)$$

(2) In the reset sequence mode where the reset mode signal is inputted, the transmission gate 27 is switched off and the oscillation frequency $f_{reset}$ of the base clock is also expressed in the following expression.

[Equation 2]

$$f_{reset} = \frac{1}{2\pi(Cr)R1} \quad (2)$$

Here, $f_{reset} > f_{normal}$.

Namely, in a normal operation mode, the capacitors Cr+Cn act as the capacitor for the RC delay circuit and in the reset sequence mode only the capacitor Cr acts as the capacitor for the RC delay circuit. Typically, the frequency of the system clock and the frequency of the clock for other circuits differ from each other such that the frequency divider 2 may generate clocks of various different frequencies by dividing the frequency of the base clock which has a higher base clock frequency.

As described above, in the reset sequence mode of the present embodiment, compared to the normal operation mode, a non volatile memory device, for example, such as a flash memory may execute the reset command input process in a short period of time when the reset command is inputted compared to conventional art by generating a base clock with a higher frequency.

Variation 1.

Figure 8:
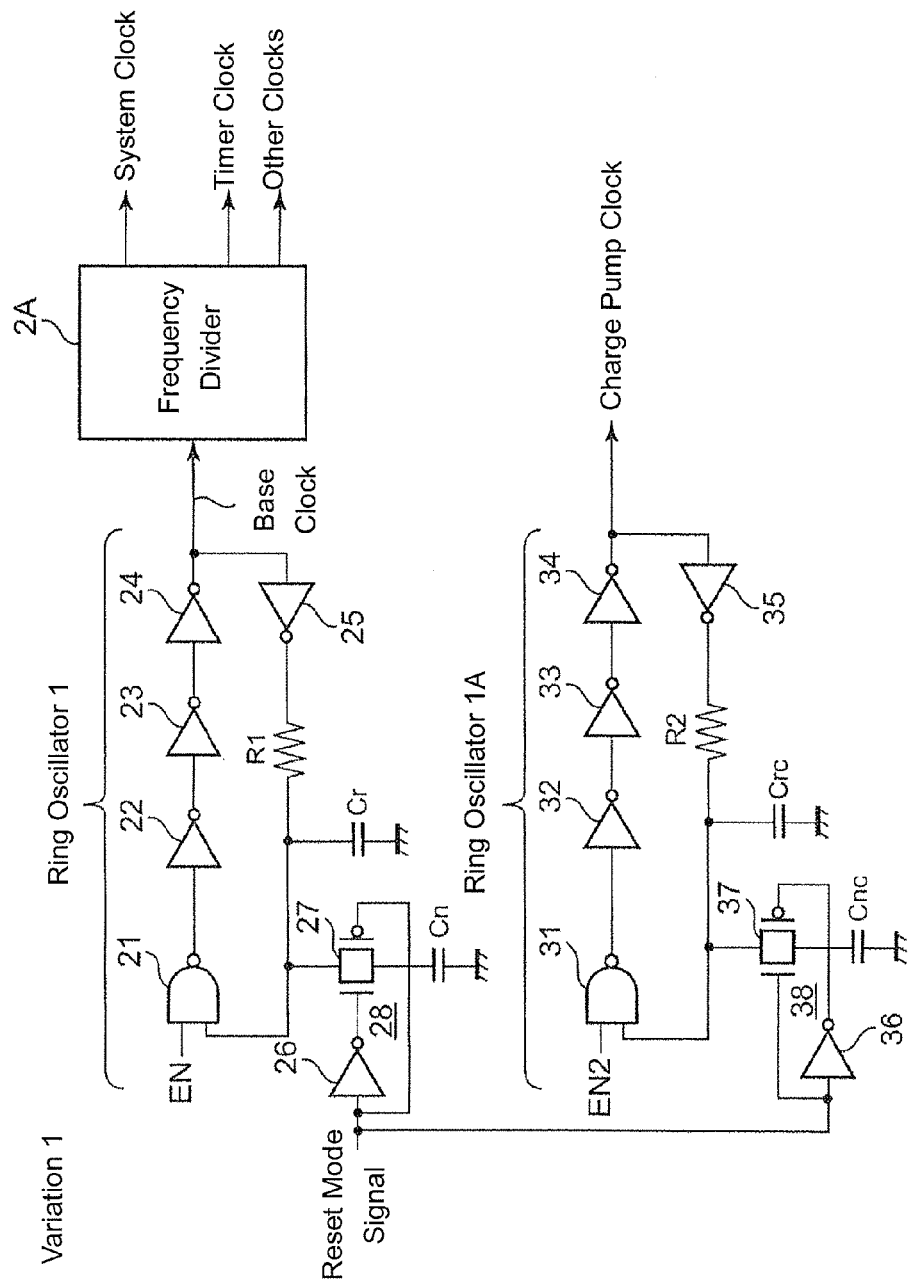
FIG. 8 is a circuit diagram illustrating a construction example of a clock generating circuit relating to a variation 1.

FIG. 8 is a circuit diagram illustrating a construction example of a clock generating circuit relating to a variation 1. Referring to FIG. 8, comparing the clock generating circuit relating to variation 1 with the clock generating circuit relating to the embodiment of FIG. 7, the differences are as described below.

(1) In place of the frequency divider 2, a frequency divider 2A is included instead. The frequency divider 2A generates the other clocks except the charge pump clock.

(2) A ring oscillator 1A for generating a charge pump clock is further included. Except for the capacitors Crc, Cnc, the ring oscillator 1A is formed similarly to the ring oscillator 1.

The differences are described in detail below.

In FIG. 8, the ring oscillator 1A is formed by including a loop circuit formed by a NAND gate 31, inverters 32~35 and a resistor R2 all formed in a loop shape, a capacitor Crc for determining a base oscillation frequency and connected to the resistor R2, a capacitor Cnc for determining an adjustment oscillation frequency and connected to an end of the resistor R2 through the transmission gate 37. Here, the on/off of the oscillation of the ring oscillator 1A may be controlled based on the clock enable signal EN2 that is inputted to the NAND gate 31. In addition, a capacitor circuit 38 for switching the capacitor Cnc to connect to the loop circuit of the ring oscillator 1A or not according to a reset mode signal is formed by the capacitor Cnc, the transmission gate 37 and the inverter 36. In addition, the reset mode signal is inputted to the inverting control input terminal of the transmission gate 37 and is inputted to a non inverting control input terminal of the transmission gate 37 through the inverter 36.

The clock generating circuit constructed above is operated as below.

(1) In a normal operating mode where the reset mode signal is not inputted, the transmission gate 37 is switched on and the oscillation frequency $f_{normalc}$ of the base clock to ignore the inverter delay is expressed in the following expression

[Equation 3]

$$f_{normalc} = \frac{1}{2\pi CrcR2} \quad (3)$$

(2) In the reset sequence mode where the reset mode signal is inputted, the transmission gate 37 is switched off and the oscillation frequency $f_{resetc}$ of the base clock is also expressed in the following expression.

[Equation 4]

$$f_{resetc} = \frac{1}{2\pi(Crc + Cnc)R2} \quad (4)$$

Here, $f_{resetc} < f_{normalc}$.

In the ring oscillator 1A constructed above, the frequency $f_{resetc}$ of the reset sequence mode is lower than the frequency $f_{normalc}$ of the normal operating mode (in a further variation, they may be the same). In the reset sequence mode, the electrical discharge process is performed by a series process, therefore the charge pump circuit is enough to retain the voltage thereof and is not required to operate at a greater performance compared to the normal operating mode.

According to variation 1, except for generating the frequency of the charge pump clock, the operation effects are similar to the embodiment.

Variation 2

Figure 9:
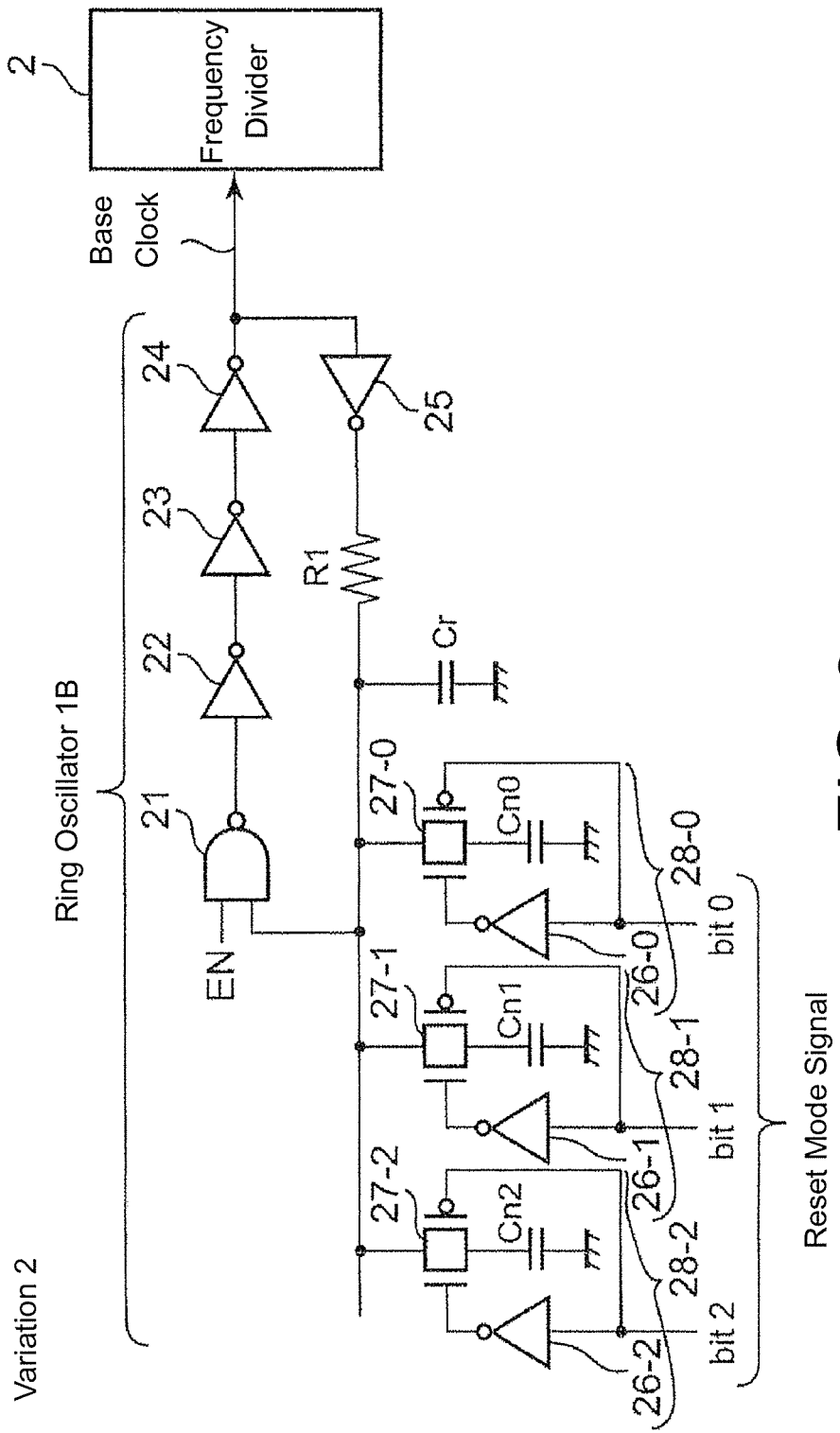
FIG. 9 is a circuit diagram illustrating a construction example of a clock generating circuit relating to a variation 2.

FIG. 9 is a circuit diagram illustrating a construction example of a clock generating circuit relating to a variation 2. Comparing the clock generating circuit relating to variation 2 with the clock generating circuit relating to the embodiment of FIG. 7, the differences are as described below.

(1) In place of the ring oscillator 1, the ring oscillator 1B is included instead. Here, in the ring oscillator 1B, in place of one capacitor circuit 28, three capacitor circuits 28-0~28-2 for switching each capacitor Cn0~Cn2 to connect to the loop circuit of the ring oscillator 1B or not according to a reset mode signal of 3 bits are included instead.

The differences are described in detail below.

In FIG. 9, similar to the capacitor circuit 28, the capacitor circuit 28-0, includes a capacitor Cn0, an inverter 26-0, a transmission gate 27-0 and switches the capacitor Cn0 to connect to the loop circuit of the ring oscillator 1B or not by the on/off control of the transmission gate 27-0 according to the bit 0 of the reset mode signal. In addition, similar to the capacitor circuit 28, the capacitor circuit 28-1 includes a capacitor Cn1, an inverter 26-1, a transmission gate 27-1 and switches the capacitor Cn1 to connect to the loop circuit of the ring oscillator 1B or not by the on/off control of the transmission gate 27-1 according to the bit 1 of the reset mode signal. Furthermore, similar to the capacitor circuit 28, the capacitor circuit 28-2 includes a capacitor Cn2, an inverter 26-2, a transmission gate 27-2 and switches the capacitor Cn2 to connect to the loop circuit of the ring oscillator 1B or not by the on/off control of the transmission gate 27-2 according to the bit 2 of the reset mode signal. Here, each capacitance of the capacitors Cn0~Cn2 may be the same with each other, or may be different from each other.

In this way, each capacitor Cn0~Cn2 may be switched to connect to the loop circuit of the ring oscillator 1B or not according to the 3 bit reset mode signal. In the reset operation, the oscillation frequency of the ring oscillator 1B may be varied in 9 ways. For example, in a wafer test, the frequency of the base clock for the reset mode may be set to an optimum frequency. Other effects are similar to the embodiment.

In addition, in the present variation, the 3 bit reset mode signal and the corresponding capacitor circuits thereof were described, however the invention is not limited thereto and adjustments are possible with a plurality of bits. The frequency of the base clock in the reset mode, may be set to different frequencies according each mode, read-out, program or erase.

In the embodiment and the variations above, the clock generating circuit for the NAND type flash memory was described, however the invention is not limited thereto, and for example, may be adapted for NOR type flash memory and such other types of non-volatile semiconductor memory device, semiconductor memory device, or semiconductor device.

In the embodiment and the variations above, the ring oscillator was described, however the invention is not limited thereto, and may be a clock generator for generating a clock.

INDUSTRIAL APPLICABILITY

As described above, in the control circuit of the semiconductor memory device and method thereof of the invention, compared to conventional art, the reset command input process may be executed by a simple method and circuit in a short period of time when a reset command is inputted, for example, in a non-volatile memory device such as a flash memory.

What is claimed is:

1. A control circuit for a non-volatile semiconductor memory device, adapted to control a clock generator for generating a system clock having a changeable frequency, wherein when a reset command is issued during a period that a read, a program or an erase operation is running on the non-volatile semiconductor memory device, the control circuit changes the frequency of the system clock generated by the clock generator from a first frequency which is for the system clock for a running operation mode to a second frequency that is higher than the first frequency, performs an interrupt process on the non-volatile semiconductor memory device, so as to enter a reset sequence mode from the running operation mode, performs a reset sequence process with the system clock of the second frequency during the reset sequence mode, and when the reset sequence process is finished and the non-volatile semiconductor memory device is returned to a state that is ready to receive an operation command, the control circuit changes the frequency of the system clock generated by the clock generator from the second frequency to the first frequency.

2. The control circuit for the non-volatile semiconductor memory device as claimed in claim 1, the control circuit comprising:

the clock generator, for generating a predetermined base clock, a frequency divider, for generating the system clock by dividing a frequency of the base clock from the clock generator.

3. The control circuit for the non-volatile semiconductor memory device as claimed in claim 1, further comprising:

another clock generator, provided in addition to the clock generator, and for generating a charge pump clock of a charge pump circuit for the semiconductor device.

4. The non-volatile semiconductor memory device as claimed in claim 1, wherein the second frequency is different in a read, a program or an erase mode.

* * * * *